US012776620B2

(12) United States Patent
Wendt

(10) Patent No.: US 12,776,620 B2
(45) Date of Patent: Oct. 27, 2026

(54) LASER DIODE LIGHTING CIRCUIT

(71) Applicant: SIGNIFY HOLDING B.V., Eindhoven (NL)

(72) Inventor: Matthias Wendt, Würselen (DE)

(73) Assignee: SIGNIFY HOLDING B.V., Eindhoven (NL)

( * ) Notice: Subject to any disclaimer, the term of this patent is extended or adjusted under 35 U.S.C. 154(b) by 578 days.

(21) Appl. No.: 18/284,203

(22) PCT Filed: Mar. 21, 2022

(86) PCT No.: PCT/EP2022/057271
§ 371 (c)(1),
(2) Date: Sep. 26, 2023

(87) PCT Pub. No.: WO2022/207377
PCT Pub. Date: Oct. 6, 2022

(65) Prior Publication Data
US 2024/0162680 A1 May 16, 2024

(30) Foreign Application Priority Data
Mar. 30, 2021 (EP) .................................... 21166068

(51) Int. Cl.
*H01S 5/042* (2006.01)
*H01S 5/06* (2006.01)
(Continued)

(52) U.S. Cl.
CPC ............ *H01S 5/042* (2013.01); *H01S 5/0608* (2013.01); *H01S 5/06825* (2013.01); *H01S 5/0683* (2013.01); *H01S 5/4018* (2013.01)

(58) Field of Classification Search
CPC .... H01S 5/042; H01S 5/0608; H01S 5/06825; H01S 5/0683; H01S 5/4018; H05B 45/12; H05B 45/22; H05B 45/48
See application file for complete search history.

(56) References Cited

U.S. PATENT DOCUMENTS

2007/0160098 A1* 7/2007 Morimoto ............ H01S 3/0941 372/38.09
2011/0068701 A1* 3/2011 Van De Ven .......... H05B 45/48 315/309
(Continued)

FOREIGN PATENT DOCUMENTS

JP 4274244 B2 6/2009
JP 2015174549 A 10/2015
WO WO-2014208048 A1 * 12/2014 ........... H04B 10/291

OTHER PUBLICATIONS

WO2014208048A1—Machine Translation (Year: 2014).*
(Continued)

*Primary Examiner* — Alexander H Taningco
*Assistant Examiner* — Pedro C Fernandez

(57) ABSTRACT

A lighting circuit comprises a current driver circuit and a series connection of at least two laser diodes, supplied with current from the current driver circuit. A current shunt circuit is in parallel with each laser diode for diverting a shunt current away from the respective laser diode. The level of the shunt currents is controlled during a start-up period of time of the current driver circuit in order to control the rate of change of voltage across selected laser diodes during said start-up period of time.

13 Claims, 2 Drawing Sheets

(51) Int. Cl.

| | |
|---|---|
| ***H01S 5/068*** | (2006.01) |
| ***H01S 5/0683*** | (2006.01) |
| ***H01S 5/40*** | (2006.01) |

(56) References Cited

U.S. PATENT DOCUMENTS

| | | | | |
|---|---|---|---|---|
| 2012/0243562 | A1 | 9/2012 | Maron et al. | |
| 2014/0226688 | A1 | 8/2014 | Ortiz | |
| 2016/0165678 | A1* | 6/2016 | Sudhaus | H05B 45/48 315/161 |
| 2019/0020173 | A1* | 1/2019 | Hasegawa | H01S 5/06825 |

OTHER PUBLICATIONS

Doug Hodgson and Bill Olsen: "App-Note #3—Protecting Your Laser Diode"; Rev01—Jan. 6, 2003, online available: https://www.newport.com/medias/sys_master/images/images/hc0/h01/8797049454622/AN03-Protecting-Your-Laser-Diode.pdf.

Aaron Browning: "Laser-diode Electronics: How to protect your laser diode from electrically caused damage", Jun. 12, 2017, online available: https://www.laserfocusworld.com/lasers-sources/article/16548195/laserdiode-electronics-how-to-protect-your-laser-diode-from-electrically-caused-damage.

Uwe Malzahn: "Driving Laser Diodes is straight forward", Photonics Tech Briefs, Europhontonics Aug./Sep. 2004, online available: http://ichaus.de/upload/pdf/EuroPhotonics_H89_2004_Driving_Diode_Lasers.pdf. The related EuroPhotonics04 slidedeck is also available: http://ichaus.de/upload/pdf/laser-handout2ups.pdf.

Dean Micke: "How to Improve Laser Diode Lifetime: Advice and Precautions on Mounting", RPMC Lasers Inc., Friday, Nov. 3, 2017, online available: https://rpmclasers.com/wp-content/uploads/products/How%20to%20Improve%20Laser%20Diode%20Lifetime.pdf.

Feng, Liefeng et. al: "Sudden Change of Electrical Characteristics at Lasing Threshold of a Semiconductor Laser";Quantum Electronics, IEEE Journal of. 43. 458-461. Jul. 2007; 10.1109/JQE.2007.895663; online: https://www.researchgate.net/profile/C_Lu4publication /2975008_Sudden_Change_of_Electrical_Characteristics_at_Lasing_Threshold_of_a_Semiconductor_Laser/links/54b3b4410cf28ebe92e2fc17/Sudden-Change-of-Electrical-Characteristics-at-Lasing-Threshold-of-a-, Jul. 2007.

Ozyazici, M. S. :"The complete electrical equivalent circuit of a double heterojunction laser diode using scattering parameters"; Journal of Optoelectronics and Advanced Materials vol. 6, No. 4, Dec. 2004, p. 1243-1253.

* cited by examiner

LASER DIODE LIGHTING CIRCUIT

CROSS-REFERENCE TO PRIOR APPLICATIONS

This application is the U.S. National Phase application under 35 U.S.C. § 371 of International Application No. PCT/EP2022/057271, filed on Mar. 21, 2022, which claims the benefit of European Patent Application No. 21166068.3, filed on Mar. 30, 2021. These applications are hereby incorporated by reference herein.

FIELD OF THE INVENTION

This invention relates to semiconductor lasers used in lighting applications.

BACKGROUND OF THE INVENTION

Semiconductor laser light sources are of increasing interest for lighting applications.

Laser diodes are known for their reliable operation with enormous brightness and high quality of light. White laser-based light sources have also recently become available. They typically employ a blue laser diode combined with a phosphor converter adding yellow components to the blue laser light resulting in a white light with CRI (Color rendering index) of about 70.

Laser diodes are sensitive components and need careful driver design even when built for a high electrical input power. It is known that a well-sustained laser diode may have a total expected lifetime of 100,000 hours, but can fail in micro seconds if electrical drive and mounting conditions are not perfectly tuned.

Inherently, laser diodes are susceptible to damage. Operating frequencies may exceed 1 GHz and, in addition to this, laser diodes are low voltage devices that are typically operated at 2-3 volts. The combination of these two factors make them very susceptible to surge-damage.

For example, when lasing increases, the increase in photons leads to heating of the crystal in the area of the mirroring facet. This increases the local temperature, which itself results in an increase in lasing. This positive feedback loop very quickly results in local overheating, causing cracks in the crystal. These cracks increase photon absorption and lead to enormous local overheating. After this has happened, the facets no longer reflect sufficiently to support lasing. This is known as Catastrophic Optical Damage (COD). The LED operation of the laser diode will however remain, so that lasers may still glow after such an event.

Laser diodes are so responsive at high frequencies that they are easily damaged by transients with relatively little energy content. This is especially true when they are operated near to their nominal power, and the headroom for any overheating effects is very limited.

To prevent COD, laser diodes need to be protected from surges. Switching on of a general supply can result in surges and short-lived spikes that are harmful to the laser diode and can destroy the device.

Overvoltage, such as due to glitches in the supply or ESD (Electro-Static Discharge) damage the semiconductor layers. Over-temperature can also directly damage or lead to a thermal runaway, as the threshold voltage and impedance change.

For high light flux applications, multiple laser diodes are bundled in one housing as a laser diode bank. The individual laser diodes may be connected in series (as a laser diode string) by means of a printed circuit board (PCB) and they can be powered from a common connector from a single shared driver. In other laser-bank implementations, multiple strings of laser diodes may be electrically connected in parallel.

This invention relates, in particular, to the control of such bundled laser diode packs. The laser diodes of the bundled laser diode pack are for example powered up together. This has several implications, for example the laser diodes cannot individually be controlled nor protected. The voltage division between the laser diodes is heavily dependent on the rate of change of current and the individual laser parameters, and this voltage division cannot be controlled. It is also not possible to address overvoltage issues at the level of the individual laser diodes when there is only a single connector or driver.

Especially when using high switching speeds, stray inductances as well as stray capacitances can severely influence the division of the overall string voltage between the individual laser diodes. In addition, the impedance of a laser diode changes at the moment it starts lasing, which substantially influences the voltage as seen over individual laser diode devices during the current ramp up.

Currently, binning procedures are required to have laser diodes with very similar voltage thresholds in any particular string. If not, a sudden increase in voltage over one device may cause the voltage to drop at the other devices which may cause ringing during power-on. Thus, multiple lasers driven from a single current source suffer from differences in threshold of the lasing current.

US 2014/0226688 discloses a driver for series connected loads, each having a laser diode. A shunt device is connected in parallel with at least one of the loads to reduce a DC pump current to the load. Thus, the shunt device means that different loads in series connection can be driven at different DC drive currents.

SUMMARY OF THE INVENTION

The invention is defined by the claims.

According to examples in accordance with an aspect of the invention, there is provided a lighting circuit comprising:

- a current driver circuit;
- a series connection of at least two laser diodes, supplied with current from the current driver circuit;
- a respective current shunt circuit in parallel with each laser diode for diverting a shunt current away from the respective laser diode; and
- a control arrangement for controlling the current shunt circuits, wherein the control arrangement is adapted to:
- control the level of the shunt currents during a start-up period of time of the current driver circuit, during which the output of the current driver circuit ramps from zero to a drive current, thereby reducing a rate of change of voltage across selected laser diodes during said start-up period of time.

This lighting circuit makes use of local circuitry shunting the current away from one or more selected laser diodes. These laser diodes are in particular the ones which start lasing earlier than others (because of the slightly different device characteristics of the laser diodes). For devices for which a high current is needed before lasing starts, the current shunting may not be required and is thus not activated.

The circuit in particular addresses the issue that high frequency components can result in crystal damage as discussed above, and these high frequency components may be generated when neighboring lasers start to lase. For example, when one laser (e.g. LD1) with a low lasing threshold is already lasing and another laser (e.g. LD2) in the series connection just starts lasing, the voltage drop over LD2 will suddenly change. This influences the voltage division in the series connection, and as a consequence results in additional current insertion at LD1. This gives the risk of inducing a failure mechanism as discussed above. The ability to control current transients reduces that risk.

Different types of laser diode may be used. One form of laser diode expected to be of particular interest in future laser lighting applications is the vertical cavity surface emitting laser (VCSEL).

This approach reduces driving effort for laser diode arrays. It provides a low effort solution when compared to active current shifting, and it may be used to make sure all laser diodes start lasing at the same moment when switched on. It may also be used to provide pixelated laser diode addressing in a simple way. This is possible by simply shunting all the current around a laser generated pixel to keep it off. These shunting elements do not need to be big and/or complex.

The control arrangement may operate local control, whereby the control of a current shunt circuit is determined based on the current and/or voltage at the respective laser diode, or there may be centralized control, whereby a central control system knows the timing of the start of lasing of all of the laser diodes and controls them all in dependence on the overall circuit response.

If there is centralized control, the lasers can be driven in order, by delaying the lasers with a low laser threshold current to make sure that they all start lasing synchronously. This helps as the voltage change during the start of lasing will not initiate current spikes in other devices which are already at nominal lasing (as they all start synchronously). In an optimal system, the voltage drops of all lasers will be synchronized and the voltage division will not be influenced. As a result, each laser diode can be made to start lasing, based on the current reaching the laser threshold level, at a desired time.

If only local control is used, so that only local voltages and currents are observed, by keeping the current rise edges controlled, the laser diodes which are already lasing can be protected from any spurious current spikes from neighboring laser diodes which are just starting to lase.

In both cases, losses as well as the drive current are balanced between the devices making sure that they are used at optimum efficiency and no current ringing occurs. There is then smooth current takeover during start of lasing. The circuit also may be used to reduce voltage jumps which arise when devices start lasing.

Lower cost laser lighting circuits are possible while avoiding the need for current binning of laser diode devices. In addition, multiple laser diode strings can be easily connected in series without sacrificing power-on behavior.

The invention in particular aims to use the shunt switch during the moment in time that the associated laser diode starts to operate in lasing mode. During the transition time to lasing, a steep negative rate of change of voltage occurs. This is caused by the current flowing through the laser diodes. The current shunt circuit is used to reduce the current through the laser diode so that the rate of change of voltage is reduced.

The lighting circuit may further comprise a filter across the output terminals of the current drive circuit.

Filtering, for example by means of a capacitor, keeps operation conditions at the laser diode string free of ringing and high frequency components. The filter can prevent the string voltage from varying rapidly.

The lighting circuit may further comprise a voltage sensor for sensing a forward voltage of each laser diode.

This enables control of the current shunting based on the voltage across the individual laser diodes.

The control arrangement may for example be adapted to control the level of the shunt currents such that each laser diode has a same forward voltage during the start-up period of time. Thus, the voltage division is made uniform.

The lighting circuit may further comprise a monitor for detecting the start of lasing of each laser diode, wherein the controller is adapted to control the shunt circuit based on the monitored start of lasing.

Laser diodes which will start lasing at a low current can thus be delayed so that the lasing takes place at the same time, and the voltage division remains uniform during the start of lasing.

The monitor may comprise a voltage monitor for monitoring a forward voltage of each laser diode and a current monitor for monitoring a laser diode current. In combination, this provides one way to detect lasing based on the electrical parameters of the laser diode.

The monitor may instead comprise a light detector for monitoring a light output of each laser diode. This provides an alternative way to detect lasing based on an external light monitor.

The control arrangement may be adapted to delay the start of lasing of selected laser diodes such that all laser diodes start lasing closer together in time. They may ideally all start lasing at the same time.

The control arrangement may be adapted to control the level of the shunt currents after the start-up period of time by ramping down to a zero shunt current. This minimizes losses in the current sourcing components.

The control arrangement may also be adapted to control the level of the shunt currents after the start-up period of time for setting non-equal currents through the laser diodes. These non-equal currents may for example be used to provide color point control when different laser diodes have different output colors.

The control arrangement may be adapted to control the level of the shunt currents after the start-up period of time by increasing a shunt current in response to a detected light output above a threshold. This may be used in order to stabilize the laser output and protect against the COD as discussed above.

The lighting circuit may further comprise:

- a series switch in series with the series connection of at least two laser diodes; and
- a detection circuit for detecting over voltage or overcurrent and controlling the series switch in response thereto.

This enables the whole string to be deactivated in the event of over voltage or over current conditions. In combination with the shunt controlling of individual laser diode currents this may allow using simple (LED grade) current drivers to supply the laser diode string.

The control arrangement may comprise a central controller which connects to each current shunt circuit.

Alternatively, the control arrangement may comprise a set of distributed controller units, each associated with a respective current shunt circuit. Each current shunt circuit then has a separate controller which may uses observation circuitry for the laser diode behavior to control the shunting.

Each laser diode and associated current shunt may comprise a module within a single housing.

The invention also provides a laser diode module for use in the lighting circuit defined above, wherein the laser diode module comprises:

a laser diode; and a current shunt circuit in parallel with the laser diode for diverting a shunt current away from the respective laser diode during a start-up period of time of the current flow to the laser diode module, thereby reducing a rate of change of voltage across the laser diode during said start-up period of time.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1:
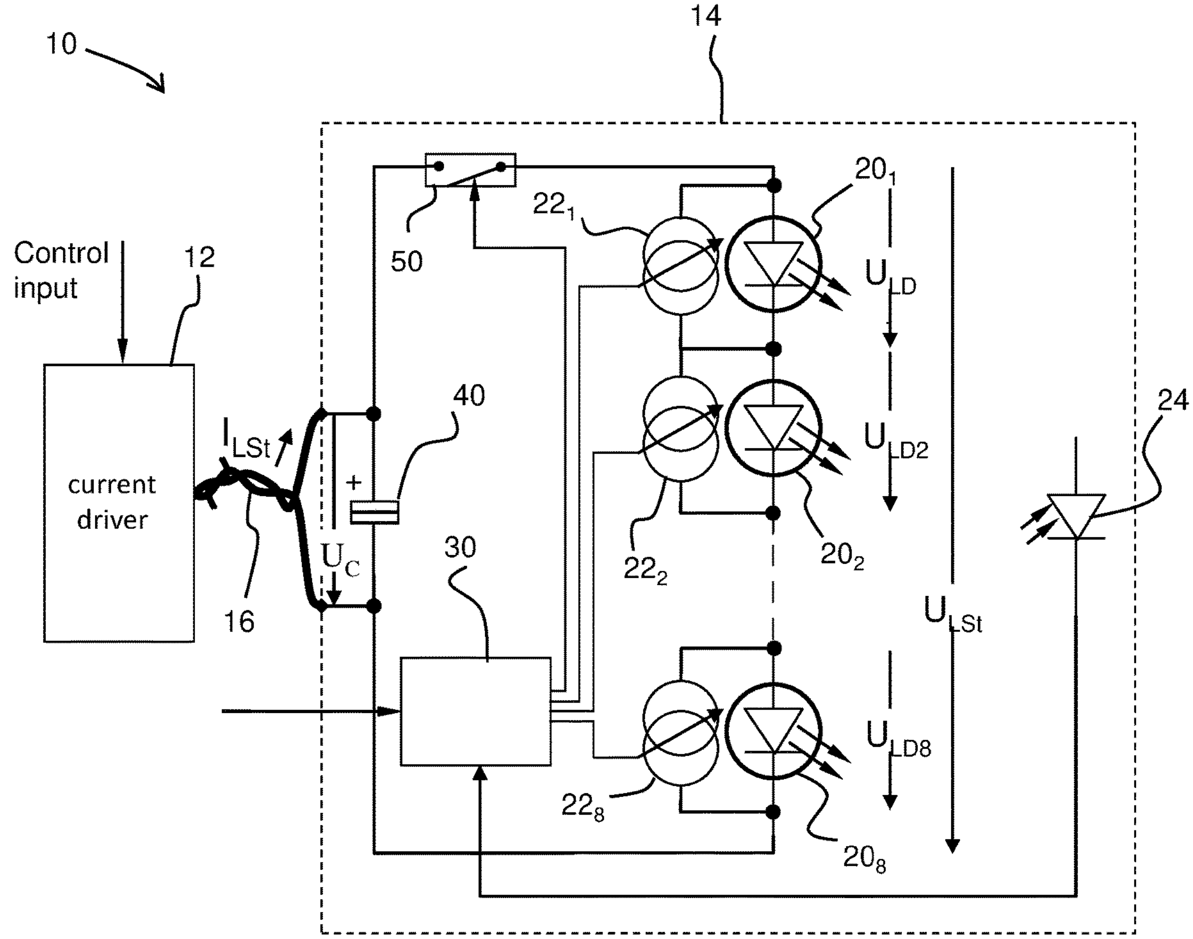
FIG. 1 shows a lighting circuit with a centralized control arrangement.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

The invention provides a lighting circuit comprising a current driver circuit and a series connection of at least two laser diodes, supplied with current from the current driver circuit. A current shunt circuit is in parallel with each laser diode for diverting a shunt current away from the respective laser diode. The level of the shunt currents is controlled during a start-up period of time of the current driver circuit in order to control the rate of change of voltage across selected laser diodes.

FIG. 1 shows a lighting circuit 10 comprising a current driver circuit 12 which connects to a lighting unit 14 for example over a twisted pair cable 16. The current driver circuit 12 delivers a regulated lighting string current $I_{LSt}$. The current level is for example controlled based on an external control input to the current driver. The driver for example comprises a switch mode power supply.

The string current may be a DC current (with different possible analogue current levels) or it may be a PWM current with constant current level. The PWM frequency needs to take account of the slopes of the current rise edges.

The lighting unit 14 comprises a series connection of at least two laser diodes, for example laser diodes $\mathbf{20}_1$ to $\mathbf{20}_8$ and they are supplied with the string current $I_{Lst}$ from the current driver circuit 12.

Each laser diode has a respective current shunt circuit $\mathbf{22}_1$ to $\mathbf{22}_8$ in parallel with the laser diode for diverting a shunt current (which is a portion or all of the string current $I_{Lst}$) away from the respective laser diode.

FIG. 1 shows an example with a central control arrangement 30 for controlling the current shunt circuits $\mathbf{22}_1$ to $\mathbf{22}_8$.

In the example shown, there is an optional monitor unit 24 for generating feedback information to the control arrangement 30 for use in controlling at least the timing but preferably also the current level of the shunt current of each current shunt circuit $\mathbf{22}_1$ to $\mathbf{22}_8$.

The levels of the shunt currents are in particular controlled during a start-up period of time of the current driver circuit 12 during which the output of the current driver circuit 12 ramps from zero to a drive current. This level may be controlled as on or off, or it may be controlled as selected one of a multi-level signal, or it may be controlled as an analog current level. The aim is to reduce a rate of change of voltage across selected laser diodes during the start-up period of time, and thereby reduce the risk of damage to the laser diodes.

In particular, the shunt control takes place when the laser diode starts to operate in lasing mode. As explained more fully below, there is a rise in forward voltage for a laser diode when it starts to lase, and this in turn causes the other laser diodes in series to experience a step down in forward voltage.

This has two consequences. First, lasing (of the other laser diodes) may not start or may be cut off momentarily which can cause disastrous oscillations between two or more laser diodes. Second, this leads to a delayed lasing for the other laser diodes in series with a higher lasing threshold current. The first laser diode may then reach full power by the time the others start lasing. This increases the risk of small overshoots due to noise in the current (e.g. because there are stray inductances reacting to the voltage steps and/or oscillations, or because the control in the driver tries counteracting for the spurious output voltage changes and overreacts). The photon headroom may then be exceeded causing facet destruction.

During the transition time from off to lasing, a steep voltage gradient (versus time) thus occurs. The current shunt circuits are used to reduce the current through the laser diodes so that the rate of change of voltage is reduced.

The current shunt circuits may for example be mounted on the backside of a PCB which carries the array of laser diodes.

The current shunt circuits are shown as controllable current sources. The current through each of the laser diodes $\mathbf{20}_1$-$\mathbf{20}_8$ is reduced by enabling the associated current shunt circuit.

The monitor 24 in this example is a light detector. It is used to inform the control arrangement 30 of the start of lasing of each individual laser diode.

As shown, the current driver circuit 12 supplies the circuit by means of two conductors 16 with the string current $I_{LSt}$. If the current diver circuit 12 is connected through a substantial length of cable, local filtering by means of a filter, such as a capacitor 40, is used to keep the operation conditions at the laser diode string free of ringing and high frequency components. The capacitor 40 keeps the overall string voltage $U_{LSt}$ from varying rapidly. The filter is across the output terminals of the current drive circuit 12 and preferably at the location of the laser diodes.

The use of the filter has the side-effect that the impedance change which arises when the first laser diode starts to lase will influence the voltage division over the string of series connected laser diodes. This will have an influence on the start of lasing in the other laser diodes.

The current shunt circuits may be used to balance the voltage division (e.g. maintain $U_{LD1}=U_{LD2}=U_{LDx}$) by controlling the shunting per laser diode and assure no spurious over voltages occur. In the example of FIG. 1 with eight laser diodes, each of the eight laser diodes has a forward voltage of ⅛ $U_{LSt}$.

When there is a central control arrangement as in the example of FIG. 1, the control arrangement is able to dynamically balance the voltage division between all laser diodes, since all laser diode voltages can be monitored centrally. Each laser diode may then include a voltage sensor (not shown in FIG. 1) so that the control arrangement can monitor the voltages at each node along the series chain.

The effect of equilibrating the voltages across the laser diodes is to make them all lase at the same time. This is achieved by keeping early lasing diodes (ones with a low threshold current) at a low lasing status until all laser diodes are starting to lase. The lasing power in all laser diodes will thereby be low when any spurious currents due to the start of lasing may occur. In this way, no fatal overheating failures occur.

In order to minimize losses in the current sourcing components, the shunt currents may be smoothly brought back to zero, in order to allow each laser diode to start lasing at its individual lasing threshold. The destructive mechanisms act in microseconds, so the shunt currents may be relaxed after a short time period, for example in the range 10 to 1000 μs. One result of the current shunting function is that the rising current edges become flattened. This has to be taken into account when setting the maximum PWM rate for the laser bank.

An external control signal may be used to influence the current division between individual laser diodes when they are being operated in their steady state (i.e. after the start-up period). This may be achieved by controlling the level of the shunt currents after the start-up period, for setting non-equal currents through the laser diodes. This may be used for example to set a specific color point in systems with multiple spectra coming from laser diodes with different color points.

The example of FIG. 1 shows an optional series switch 50 which allows the deactivation of the whole string in the case of over voltage or over current conditions. For this purpose, there may be a voltage monitor for monitoring a forward voltage of each laser diode and a current monitor for monitoring a laser diode current.

In combination with the control of the shunt currents for individual laser diodes, this may allow the use of simple (LED grade) current drivers to supply the laser diode string.

FIG. 1 shows a centralized control arrangement 30. Instead, the control arrangement may be distributed. Each current shunt circuit then has a separate controller which uses observation circuitry for the laser diode behavior to control the shunting.

One way to control the shunting is by means of light flux observation as discussed above, using the monitor 24. The current source may then be directly controlled based on the flux emitted. If there is no flux, there is no need for current shunting. If there is a lasing flux, the current shunting is enabled.

In order to eliminate the losses caused by the shunting process, the shunting may start when lasing starts with a fixed shunting current, and then ramp automatically down to zero. This gives any filters (parasitic or designed) in the laser string supply sufficient time to discharge. This is particularly relevant as the laser diode string has a lower supply voltage than the string before start of lasing.

Shunting current away from the laser diodes when the flux rises above a nominal value may also be used in order to stabilize the laser output and protect against thermal runaway in the resonating crystal.

The monitoring of the forward voltage of the laser diodes may also be used to compensate for the drop in impedance as reported by Feng, Liefeng et. al: "Sudden Change of Electrical Characteristics at Lasing Threshold of a Semiconductor Laser"; Quantum Electronics, IEEE Journal of 43. 458-461. 2007. The current shunting does not require any access to or change in the optical path.

Figure 2:
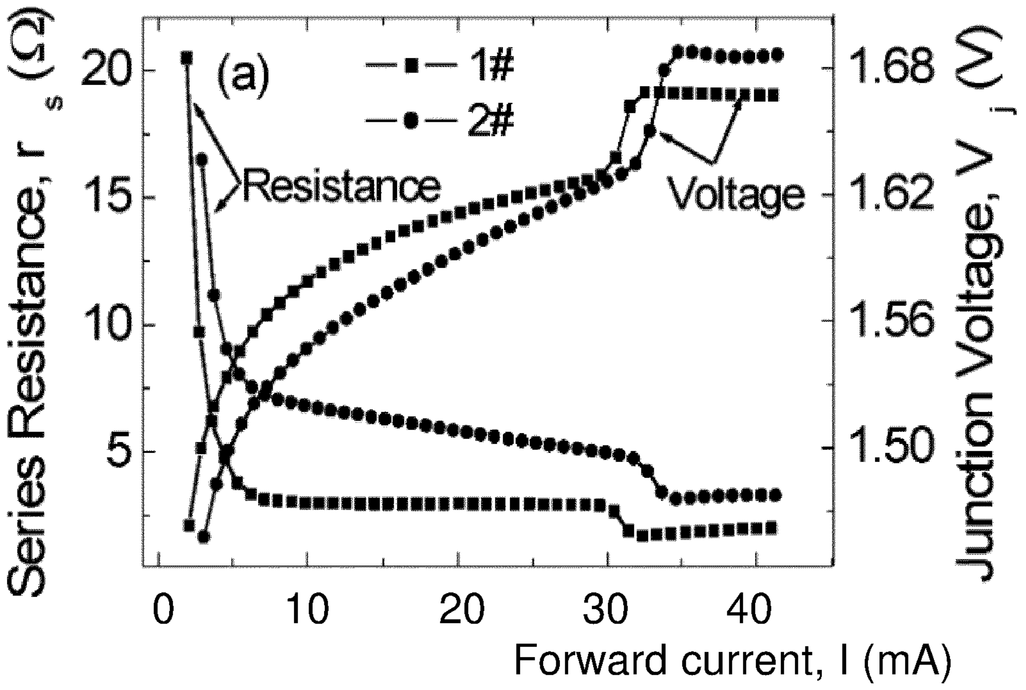
FIG. 2 shows laser diode characteristics at the start of lasing.

FIG. 2 is repeated from this reference. It shows the resistance and junction voltage as a function of current for two different laser diodes. The lasing threshold in each case is around 30 mA.

The measurements show that at the start of lasing, the laser diode impedance falls. A drop in the forward voltage might be expected in response to the drop in impedance, but instead there is a step increase in the forward voltage, as mentioned above. In particular, the junction voltage jumps abruptly to a saturated value at the onset of lasing. Electrically, the input power increases at this time, corresponding to the increase in optical output power at lasing.

The voltage jump can be explained as a reaction inside the laser crystal when the number of photons is rising due to lasing, which reduces the recombination rate of electrons generating photons. Thus, this voltage behavior is directly related to the start of lasing. The effect is explained in Feng as being caused by a photo diode effect resulting from high photon density in the lasing layer.

Electrical monitoring instead of the external optical monitoring shown in FIG. 1 is thus sufficient for detecting the moment when the current exceeds the lasing threshold and the voltage division in a string connection may be unbalanced.

Furthermore, the amplitude of the voltage jump can be used to steer the current to be shunted away from the laser diode in order to enable the voltage to remain steady as seen from the outside or driver side.

Thus, the monitor for detecting the start of lasing may comprise a voltage monitor for monitoring a forward voltage of each laser diode and a current monitor for monitoring a laser diode current.

As explained above, the control arrangement may be distributed.

Figure 3:
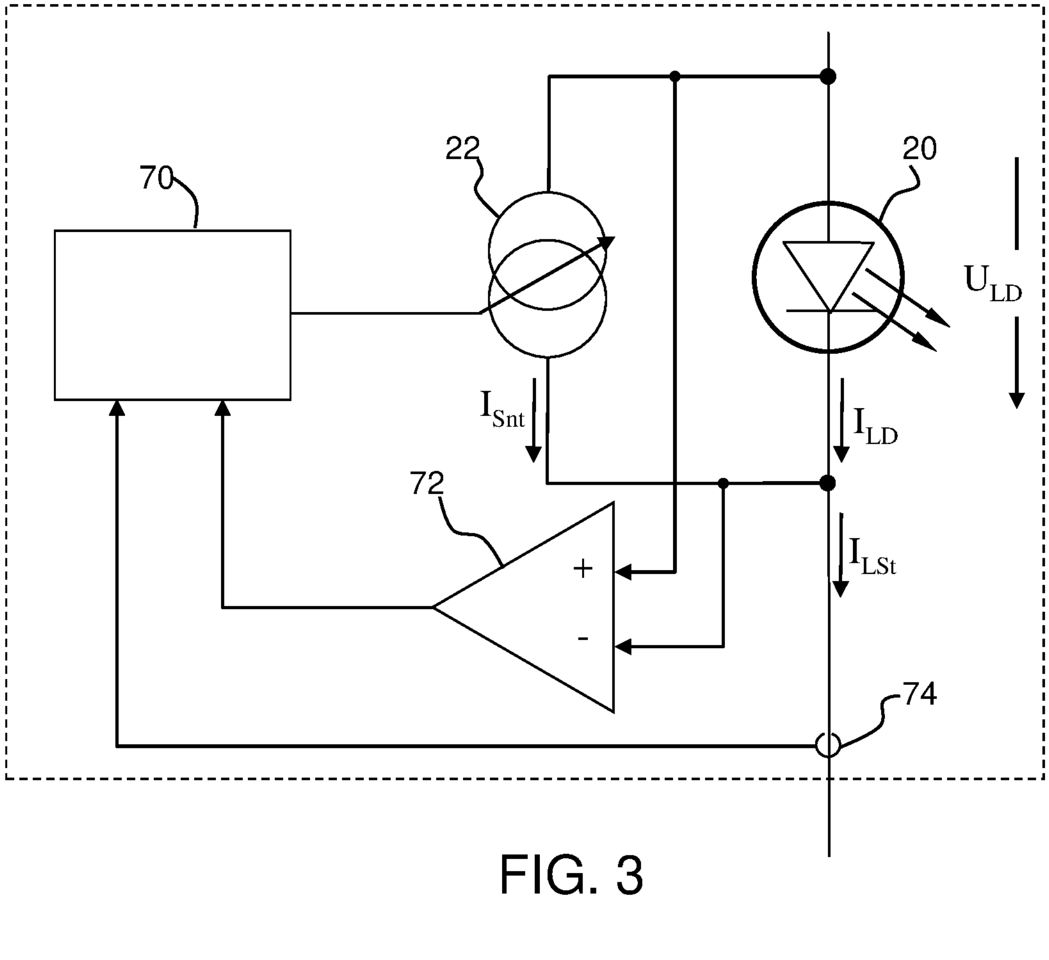
FIG. 3 shows part of a lighting circuit with a distributed control arrangement.

FIG. 3 shows a single laser diode 20 and its associated current shunt circuit 22, as a well as a local control circuit 70. The forward voltage is obtained using a measurement amplifier 72 which obtains a voltage difference between the anode and cathode of the laser diode 20. A current sensor 74 provides sensing of the string current to the local control circuit.

When the voltage jumps without a related jump in the string current $I_{LSt}$ the controller 70 operates the current switching circuit 22 to carry as much current $I_{Snt}$ as required to compensate for the jump. In this way, the protection method involves slowing down the start of lasing by stealing current from the laser diode when lasing commences. The dynamics in the series connection are thereby reduced. Each laser diode will then start lasing at its respective individual lasing threshold current, but the lasing increase will be moderated.

This shunting is however implemented carefully such that the current $I_{LD}$ is not allowed to drop below the lasing threshold current. As a result, a minimal voltage jump may remain. However, the effect of the jumping device voltage in the string will be mitigated. The individual lasing threshold current can be measured by the controller as it is the current when the voltage starts jumping.

The shunting circuitry as well as the controller and the measurement circuitry may be supplied with power by scavenging from the voltage $U_{LD}$ over the laser diode 20. It will hence not consume power when the laser is off.

In circuits where the laser is pulsed, it might be advised to have a small local power storage in order to keep the current shunt circuit supplied during the off period of a pulse width modulation control of the laser diode sting current.

In the case of PWM current control, the shunt currents will be controlled at each PWM rising edge. Typical PWM duty cycles for LED lighting are above 400 Hz. High frequency operation around or above 20 kHz is also used to prevent audible noise.

At such elevated frequencies, the influence of a slowdown of the rising edge of ones or tens of microseconds (as implemented by a distributed controller) can already cause visible distortions, as the full cycle is then only 50 μs. Therefore, the PWM frequency in this application is typically in the range 400 Hz to 1000 Hz. A delay of the current ramp-up time may be at most 100 μs, allowing for minimally distorted PWM of about 250 Hz-400 Hz.

When using a central controller, which only delays the lasing until all laser diodes start synchronously, high PWM frequencies may still be viable. A typical delay will be 1 to 10 μs dependent on the current rise timing of the PWM driver.

The current shunt circuit may be integrated with the laser diode in a single housing as the current shunt circuit does not need to be large or complex. If no external control is needed and only smooth voltage transitions are desired, a simple measurement analog circuit may be used. This can be integrated on a single die so integration in a laser diode housing is viable. Such an integrated protection circuitry does not require any additional housing pins or wires.

In another example, the current shunting may be used to stabilize color or color temperature in a multi laser diode system with multiple spectral contributions.

The circuit may also be applied for the selective driving of individual laser diode sources in one string as individual pixels. This is possible by simply shunting all the current around a pixel to keep it off. The smooth current takeovers can be guaranteed by soft adjustments of the current sources in order to omit any ringing or risking over voltage at the other pixels.

In another example, the control of the current shunt circuits may be guided by external parameters such as the temperature of the cooling aid of the laser diode arrangement. The lasing threshold for each laser diode may be calibrated over the typical temperature range. Feed forward calculations can compensate for the temperature difference between the cooling aid temperature and the semiconductor temperature.

In a refinement, the monitoring unit (e.g. for monitoring the total flux generated by the bank of laser diodes) may be used to check whether the lasing threshold is as expected from calibration. It may be recalibrated during its lifetime whenever substantial differences to the calibration are detected. Auto-calibration may be supported e.g. during power up/power-down cycles when required. For these auto-calibration functions, the current slope may be slow to allow accurate measurements.

The invention is for example of particular interest for spotlight applications, e.g. in museums and retail, multi-color laser applications like projection and city beautification, and for structured light laser projection.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

The mere fact that certain measures are recited in mutually different dependent claims does not indicate that a combination of these measures cannot be used to advantage.

If the term "adapted to" is used in the claims or description, it is noted the term "adapted to" is intended to be equivalent to the term "configured to".

Any reference signs in the claims should not be construed as limiting the scope.

The invention claimed is:

1. A lighting circuit comprising:
- a current driver circuit;
- a series connection of at least two laser diodes, supplied with current from the current driver circuit;
- a respective current shunt circuit in parallel with each laser diode for diverting a shunt current away from the respective laser diode; and
- a control arrangement for controlling the current shunt circuits, wherein the control arrangement is adapted to:
- control a level of the shunt currents during a start-up period of time of the current driver circuit, during which the output of the current driver circuit ramps from zero to a drive current, thereby reducing a rate of change of voltage across selected laser diodes during said start-up period of time, wherein the lighting circuit further comprises a monitor for detecting the start of lasing of each laser diode, wherein the controller is adapted to control the shunt circuit based on the monitored start of lasing.

2. The lighting circuit of claim 1, further comprising a filter across output terminals of the current drive circuit.

3. The lighting circuit of claim 1, further comprising a voltage sensor for sensing a forward voltage of each laser diode.

4. The lighting circuit of claim 3, wherein the control arrangement is adapted to control the level of the shunt currents such that each laser diode has a same forward voltage during the start-up period of time.

5. The lighting circuit of claim 1, wherein the monitor comprises a voltage monitor for monitoring a forward voltage of each laser diode and a current monitor for monitoring a laser diode current.

6. The lighting circuit of claim 1, wherein the monitor comprises a light detector for monitoring a light output of each laser diode.

7. The lighting circuit of claim 1, wherein the control arrangement is adapted to delay the start of lasing of selected laser diodes such that all laser diodes start lasing closer together in time.

8. The lighting circuit of claim 1, wherein the control arrangement is adapted to control the level of the shunt currents after the start-up period of time by ramping down to a zero shunt current.

9. The lighting circuit of claim 1, wherein the control arrangement is adapted to control the level of the shunt currents after the start-up period of time for setting non-equal currents through the laser diodes.

10. The lighting circuit of claim 1, wherein the control arrangement is adapted to control the level of the shunt currents after the start-up period of time by increasing a shunt current in response to a detected light output above a threshold.

11. The lighting circuit of claim 1, further comprising:

a series switch in series with the series connection of at least two laser diodes; and a detection circuit for detecting overvoltage or overcurrent and controlling the series switch in response thereto.

12. The lighting circuit of claim 1, wherein the control arrangement comprises:

a central controller which connects to each current shunt circuit; or a set of distributed controller units, each associated with a respective current shunt circuit.

13. The lighting circuit of claim 1, wherein each laser diode and associated current shunt comprise a module within a single housing.

* * * * *